United States Patent
Ramdani et al.

(10) Patent No.: US 7,846,806 B1
(45) Date of Patent: Dec. 7, 2010

(54) SYSTEM AND METHOD FOR PROVIDING A SELF ALIGNED SILICON GERMANIUM (SIGE) HETEROJUNCTION BIPOLAR TRANSISTOR USING A MESA EMITTER-BASE ARCHITECTURE

(75) Inventors: Jamal Ramdani, Scarborough, ME (US); Mingwei Xu, South Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 398 days.

(21) Appl. No.: 11/807,216

(22) Filed: May 25, 2007

(51) Int. Cl.
*H01L 21/331* (2006.01)
*H01L 21/8222* (2006.01)

(52) U.S. Cl. ............ 438/312; 438/313; 438/319; 438/320; 438/343; 438/369; 257/197; 257/198

(58) Field of Classification Search .......... 438/312, 438/319, 320, 343, 364; 257/197–198
See application file for complete search history.

(56) References Cited

U.S. PATENT DOCUMENTS

| | | | | |
|---|---|---|---|---|
| 5,177,583 A * | 1/1993 | Endo et al. | ............ | 257/190 |
| 5,331,186 A * | 7/1994 | Morizuka | ............ | 257/198 |
| 5,399,880 A * | 3/1995 | Chand | ............ | 257/21 |
| 5,424,227 A | 6/1995 | Dietrich et al. | | |
| 5,821,149 A | 10/1998 | Schuppen et al. | | |
| 6,403,436 B1 * | 6/2002 | Tanomura | ............ | 438/312 |
| 6,551,889 B2 * | 4/2003 | Kovacic | ............ | 438/312 |
| 6,624,449 B1 * | 9/2003 | Scott et al. | ............ | 257/184 |
| 6,780,695 B1 * | 8/2004 | Chen et al. | ............ | 438/202 |
| 6,906,401 B2 | 6/2005 | Dunn et al. | | |
| 2001/0039095 A1 * | 11/2001 | Marty | ............ | 438/321 |
| 2003/0098465 A1 * | 5/2003 | Suzumura et al. | ............ | 257/197 |
| 2004/0033671 A1 * | 2/2004 | Verma et al. | ............ | 438/339 |
| 2006/0030113 A1 * | 2/2006 | Miyajima et al. | ............ | 438/312 |
| 2008/0050883 A1 * | 2/2008 | Enicks | ............ | 438/312 |

OTHER PUBLICATIONS

Herbert Kroemer, "Theory of a Wide-Gap Emitter for Transistors," Proceeding of the IRE, Nov. 1957, pp. 1535-1537.
Raminderpal Singh et al., "Scanning the Issue, Silicon Germanium—Advanced Technology, Modeling, and Design," Proceeding of the IEEE, vol. 93, No. 9, Sep. 2005, pp. 1519-1521.
Steve Hall et al., "Silicon-germanium for ULSI," Journal of Telecommunications and Information Technology, Mar.-Apr. 2000, pp. 3-9.
John D. Cressler, "SiGe HBT Technology: A New Contender for Si-Based RF and Microwave Circuit Applications," IEEE Transactions on Microwave Theory and Techniques, vol. 46, No. 5, May 1998, pp. 572-589.

(Continued)

*Primary Examiner*—Ha Tran T Nguyen
*Assistant Examiner*—Karen M Kusumakar

(57) ABSTRACT

A system and method are disclosed for providing a self aligned silicon germanium (SiGe) heterojunction bipolar transistor using a mesa emitter-base architecture. The transistor of the present invention comprises a non-selective epitaxial growth (NSEG) collector, an NSEG base, an NSEG emitter and a raised external base that is formed by the selective epitaxial growth (SEG) of a doped polysilicon layer.

20 Claims, 4 Drawing Sheets

OTHER PUBLICATIONS

D. Behammer et al., "Fully self-aligned double mesa SiGe-HBT with external transistor optimisation," Electronics Letters, Sep. 12, 1996, vol. 32, No. 19, pp. 1830-1832.

D. Behammer et al., "Base Contact Resistance Limits to Lateral Scaling of Fully Self-Aligned Double Mesa SiGe-HBTs," Solid-State Electronics, vol. 41, No. 8, 1997, pp. 1105-1110.

Bernard S. Meyerson, "UHV/CVD Growth of Si and Si:Ge Alloys: Chemistry, Physics, and Device Applications," Proceedings of the IEEE, vol. 80, No. 10, Oct. 1992, pp. 1592-1608.

Subramanian S. Iyer et al., "Heterojunction Bipolar Transistors Using Si-Ge Alloys," IEEE Transactions on Electron Devices, vol. 36, No. 10, Oct. 1989, pp. 2043-2064.

* cited by examiner

US 7,846,806 B1

SYSTEM AND METHOD FOR PROVIDING A SELF ALIGNED SILICON GERMANIUM (SIGE) HETEROJUNCTION BIPOLAR TRANSISTOR USING A MESA EMITTER-BASE ARCHITECTURE

TECHNICAL FIELD OF THE INVENTION

The system and method of the present invention is generally directed to the manufacture of integrated circuits and, in particular, to a system and method for providing a self aligned silicon germanium (SiGe) heterojunction bipolar transistor using a mesa emitter-base architecture.

BACKGROUND OF THE INVENTION

Silicon germanium (SiGe) heterojunction bipolar transistors are employed in an increasing number of integrated circuit applications. Development of silicon germanium (SiGe) heterojunction bipolar transistor technology has been very rapid since the first functional silicon germanium (SiGe) heterojunction bipolar transistor was introduced in December 1987. The first silicon germanium (SiGe) heterojunction bipolar transistor technology entered commercial production on 200-mm wafers in 1994.

The technical advantages that are provided by silicon germanium (SiGe) heterojunction bipolar transistor technology continue to be investigated by researchers in the semiconductor industry. There continues to be a need in the art for systems and methods that provide improvements in silicon germanium (SiGe) heterojunction bipolar transistor technology.

The system and method of the present invention provides an improved self aligned silicon germanium (SiGe) heterojunction bipolar transistor that uses a mesa emitter-base architecture. The transistor of the present invention comprises a non-selective epitaxial growth (NSEG) collector, an NSEG base, an NSEG emitter and a raised external base that is formed by the selective epitaxial growth (SEG) of a doped polysilicon layer.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
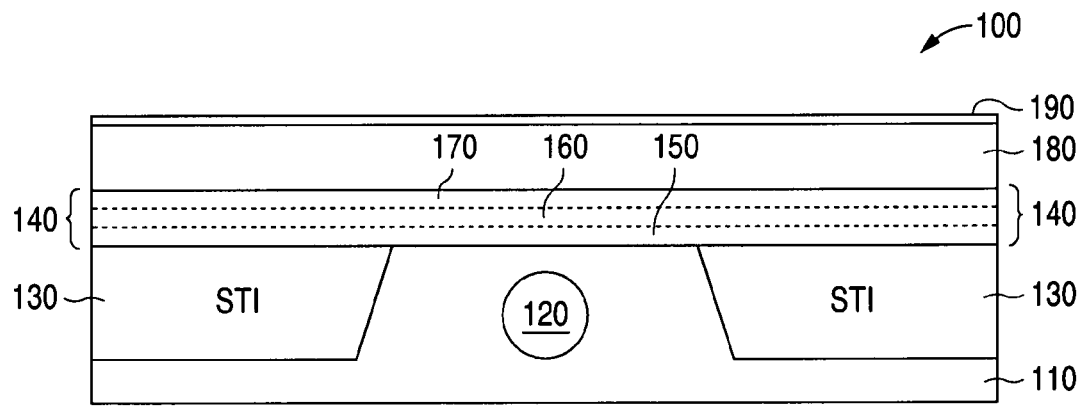
FIG. 1 illustrates a schematic diagram of a cross section of a structure formed during the manufacture of a self aligned silicon germanium (SiGe) heterojunction bipolar transistor of the present invention.
Figure 2:
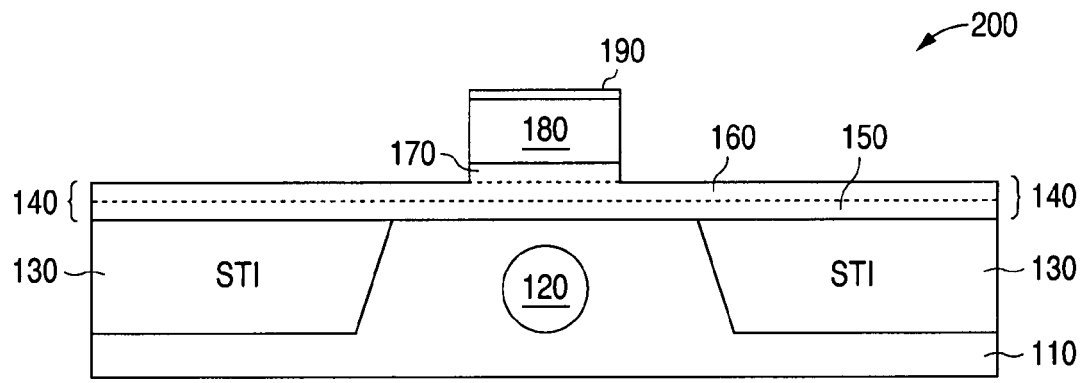
FIGS. 2 through 7 illustrate schematic diagrams that show successive key steps in the manufacture of a self aligned silicon germanium (SiGe) heterojunction bipolar transistor of the present invention.
Figure 3:
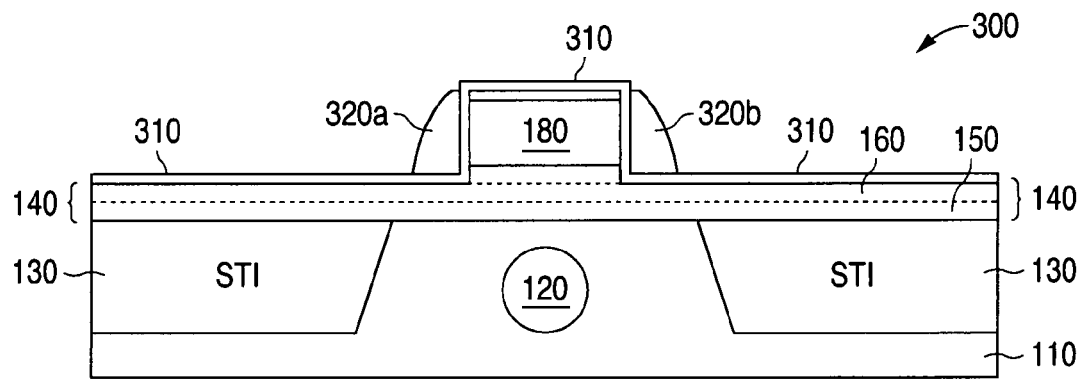
Figure 4:
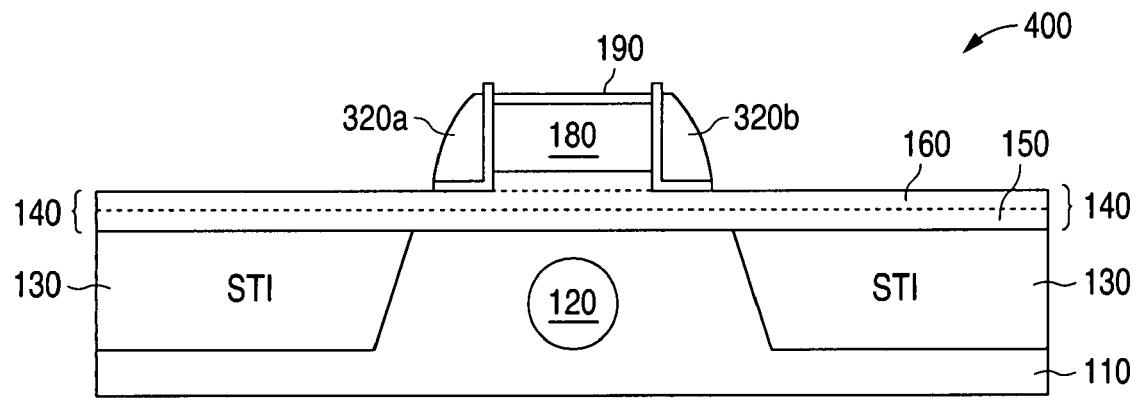
Figure 5:
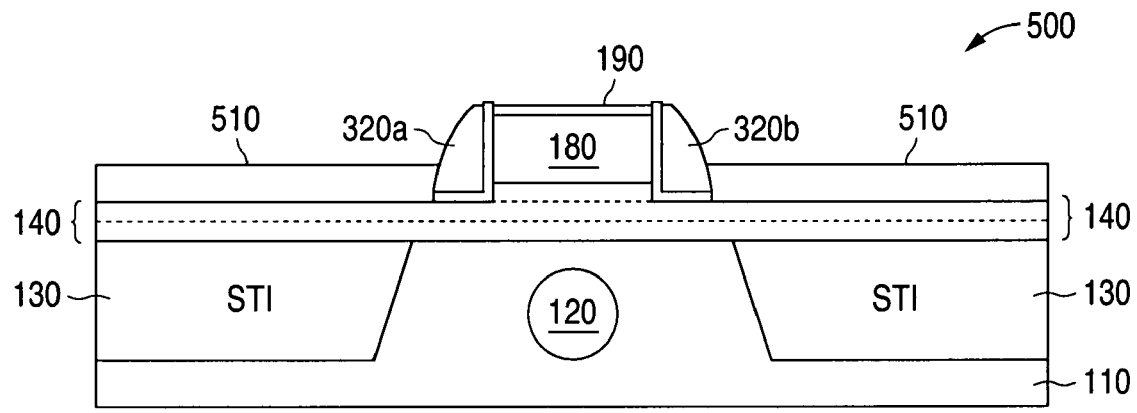
Figure 6:
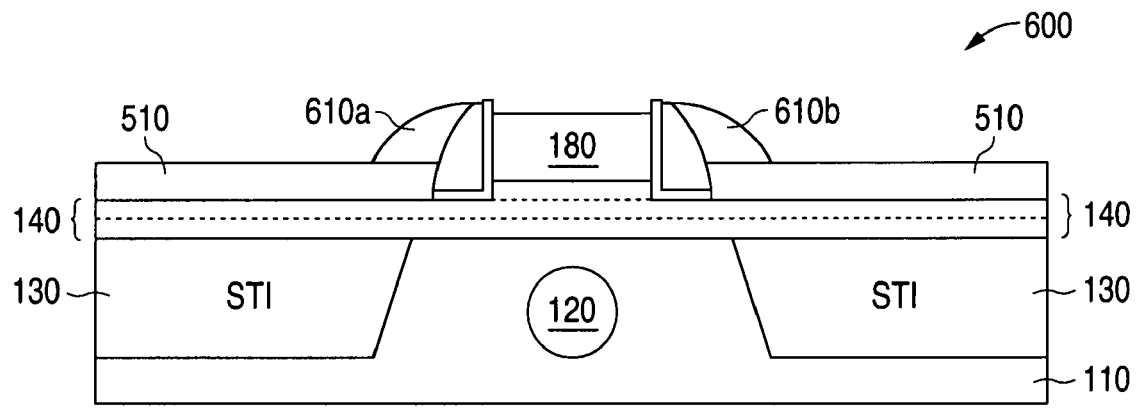
Figure 7:
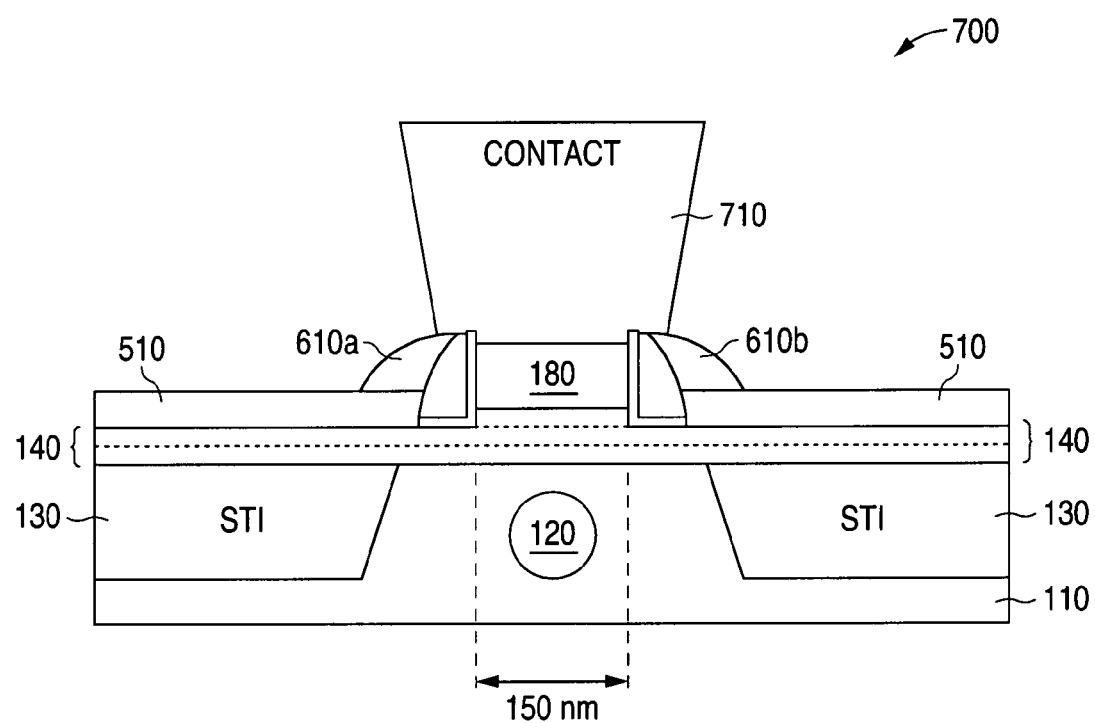

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit device.

To simplify the drawings the reference numerals from previous drawings will sometimes not be repeated for structures that have already been identified. For purposes of clarity of illustration the thickness of the structures will sometimes not be drawn to scale. The values of thickness that are given for the structures of the invention are illustrative. It is understood that other values of thickness for the structures could be used to practice the method of the invention.

FIGS. 1 through 7 illustrate schematic diagrams that show successive key steps in the manufacture of a self aligned silicon germanium (SiGe) heterojunction bipolar transistor of the present invention. FIG. 1 illustrates a schematic diagram of a cross section of a structure 100 that is initially formed during the manufacture of a self aligned silicon germanium (SiGe) heterojunction bipolar transistor of the present invention.

The structure 100 shown in FIG. 1 comprises a Non-Selective Epitaxial Growth (NSEG) collector 110 and a selective implanted collector (SIC) 120 located within a central portion of the NSEG collector 110. The central portion of the NSEG collector 110 is located between two shallow trench isolation (STI) structures 130.

During the manufacture of the structure 100 shown in FIG. 1, a Non-Selective Epitaxial Growth (NSEG) base 140 is grown over the NSEG collector 110 and over the STI structures 130. The NSEG base 140 comprises three layers (150, 160, 170). The first layer 150 comprises a layer of silicon (Si). The second layer 160 comprises a layer of silicon germanium (SiGe). The third layer 170 comprises a layer of silicon (Si).

In one advantageous embodiment of the method of the invention, a thickness of the NSEG base 140 is approximately sixty nanometers (60 nm); a thickness of the first layer 150 (of silicon) is approximately ten nanometers (10 nm); a thickness of the second layer 160 (of silicon germanium) is approximately thirty five nanometers (35 nm); and a thickness of the third layer 170 (of silicon) is approximately fifteen nanometers (15 nm).

A Non-Selective Epitaxial Growth (NSEG) monocrystalline silicon emitter 180 is grown over the NSEG base 140. In one advantageous embodiment of the method of the invention, a thickness of the (NSEG) monocrystalline silicon emitter 180 is approximately two hundred nanometers (200 nm). In one advantageous embodiment of the method of the invention, the NSEG base 140 and the NSEG emitter 180 can be grown in a single Non-Selective Epitaxial Growth (NSEG) run.

Then a first layer of silicon nitride 190 is placed over the NSEG monocrystalline silicon emitter 180. In one advantageous embodiment of the method of the invention, a thickness of the first silicon nitride 190 is approximately twenty nanometers (20 nm). The result of applying these procedures is shown in the structure 100 shown in FIG. 1.

Then a mask (not shown) is provided to mask central portions of the first layer of silicon nitride 190. A mask and etch procedure is applied to etch away non-central portions of the first silicon nitride 190 and the NSEG emitter 180 and the third layer 170 (of silicon) of the NSEG base 140. The etch stops on the top of the second layer 160 (of silicon germanium (SiGe)) of the NSEG base 140. The mask is then removed. The result of applying the mask and etch procedure is shown in the structure 200 in FIG. 2.

The portion of the third layer 170 (of silicon) of the NSEG base 140 has the form of a "mesa" structure because it rises above the topmost level of the second layer 160 (of silicon germanium (SiGe)) in the same fashion as a geological mesa rises above a surrounding plain. Together the NSEG monocrystalline silicon emitter 180 and the "mesa" structure of the third layer 170 (of silicon) of the NSEG base 140 form a "mesa" type emitter-base architecture.

In the next step of the method a layer of silicon oxide 310 (e.g., tetraethyloxysilane 310) is placed over the structure 200. In one advantageous embodiment of the method of the invention, a thickness of the silicon oxide 310 is approximately twenty nanometers (20 nm).

Then a second layer of silicon nitride 320 is placed over the silicon oxide 310. An unmasked etch procedure is then applied to etch away portions of the second silicon nitride 320 to form first silicon nitride spacers (320a and 320b). The result of applying these procedures is shown in the structure 300 in FIG. 3.

Then a diluted hydrofluoric acid (HF) etch procedure is applied to etch away the exposed portions of the silicon oxide 310. The HF etch procedure removes the portions of the silicon oxide 310 that are not located under the first silicon nitride spacers (320a and 320b). The HF etch procedure also removes the portions of the silicon oxide 310 that are located above the silicon nitride 190. The removal of the silicon oxide 310 exposes the underlying second layer 160 (of silicon germanium (SiGe)) of the NSEG base 140. The result of applying the HF etch procedure is shown in the structure 400 in FIG. 4.

Then a Selective Epitaxial Growth (SEG) procedure is applied to grow an in-situ doped polysilicon layer 510 to form a raised external base. The in-situ doped polysilicon layer 510 is grown on the exposed second layer 160 (of silicon germanium (SiGe)) of the NSEG base 140. The result of growing the in-situ doped polysilicon layer 510 to form a raised external base is shown in the structure 500 in FIG. 5.

Then a third layer of silicon nitride 610 is placed over the structure 500. An unmasked etch procedure is then applied to etch away portions of the third layer of silicon nitride 610 to form second silicon nitride spacers (610a and 610b). The etch procedure also etches away the remaining portions of the first layer of silicon nitride 190 located over the NSEG monocrystalline silicon emitter 180. The result of applying these procedures is shown in the structure 600 in FIG. 6.

Then a contact structure 710 is formed to provide an electrical contact to the top surface of the NSEG monocrystalline silicon emitter 180. The result of forming the contact structure 710 is shown in the structure 700 in FIG. 7. In one advantageous embodiment of the method of the invention, a width of the (NSEG) monocrystalline silicon emitter 180 is approximately one hundred fifty nanometers (150 nm).

The system and method of the present invention provides several significant advantages. The present invention provides a self aligned silicon germanium (SiGe) heterojunction bipolar transistor that has emitter-base structure in which the NSEG monocrystalline silicon emitter 180 can be formed in the same NSEG growth process as the NSEG base 140. This significantly simplifies the mono emitter process. The emitter-base junction is confined by the side wall spacers of silicon nitride 310 (e.g., tetraethyloxysilane 310). This means that there is little peripheral emitter-base junction.

The Selective Epitaxial Growth (SEG) procedure is only used to grow an in-situ doped polysilicon layer 510 for the raised external base. Using the SEG procedure only for growing the raised external base is much easier than the approach used in a Fully Self Aligned (FSA) architecture.

There is no hydrofluoric acid (HF) etch procedure used to form an emitter window. This means that, unlike prior art methods, there is no disadvantage to etch an undercut to enlarge the actual emitter window. The emitter 180 of the present invention is formed by light-field lithography. This means that the emitter 180 may be formed with better critical dimensions (e.g., 150 nm width) given the same lithography tool.

Figure 8:
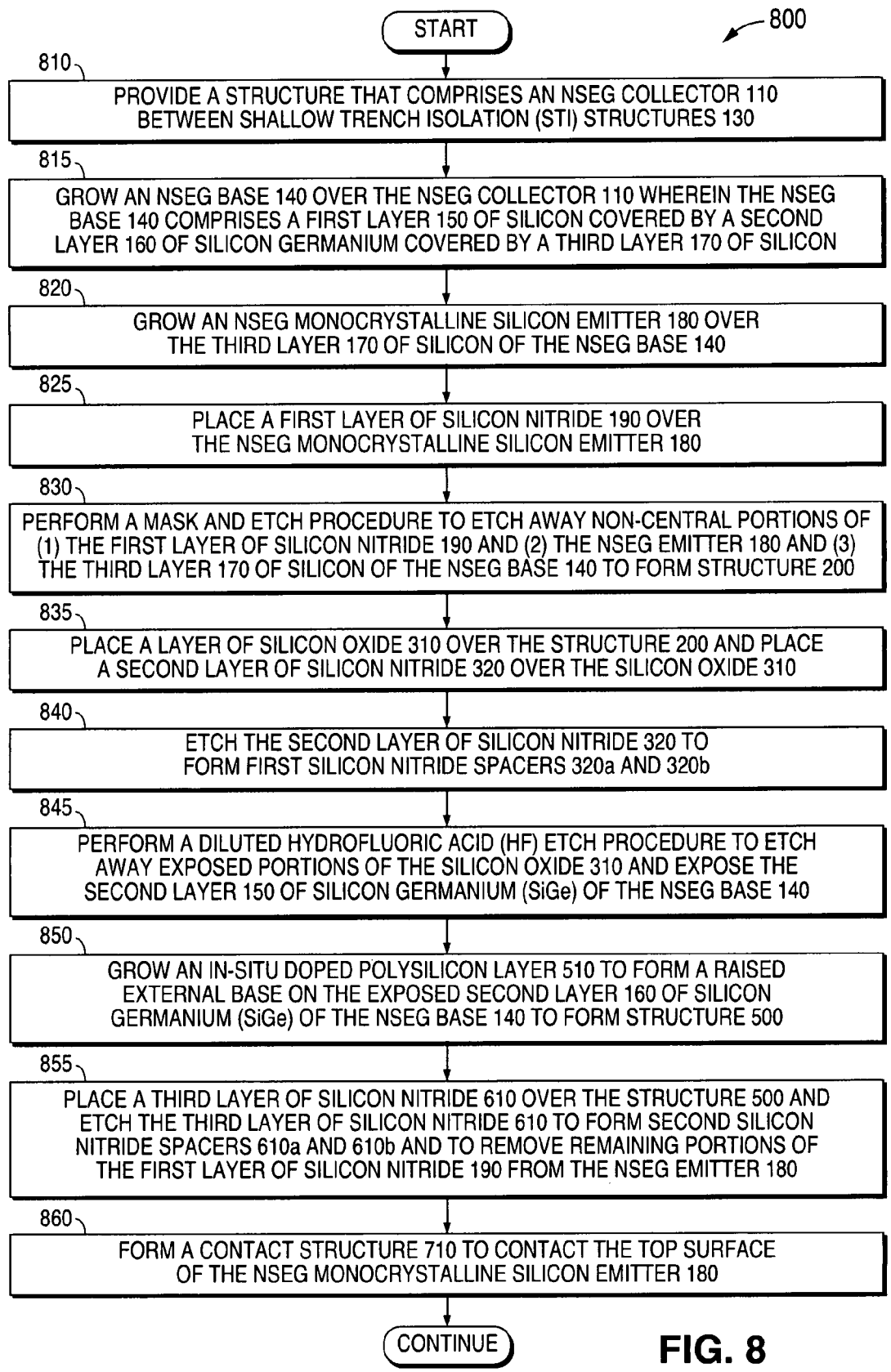
FIG. 8 illustrates a flow chart showing the steps of an advantageous embodiment of a method of the present invention.

FIG. 8 illustrates a flow chart showing the steps of an advantageous embodiment of a method of the present invention. In the first step of the method a structure is provided that comprises an NSEG collector 110 between shallow trench isolation (STI) structures 130 (step 810). Then an NSEG base 140 is grown over the NSEG collector 110 wherein the NSEG base 140 comprises a first layer 150 of silicon covered by a second layer 160 of silicon germanium (SiGe) covered by a third layer 170 of silicon (step 815).

Then an NSEG monocrystalline silicon emitter 180 is grown over the NSEG third layer 170 of silicon of the NSEG base 140 (step 820). Then a first layer of silicon nitride 190 is placed over the NSEG monocrystalline silicon emitter 180 (step 825). Then a mask and etch procedure is performed to etch away non-central portions of (1) the first layer of silicon nitride 190, and (2) the NSEG emitter 180, and (3) the third layer 170 of silicon of the NSEG base 140 to form a structure 200 (step 830).

In the next step of the method a layer of silicon oxide 310 (e.g., tetraethyloxysilane 310) is placed over the structure 200 and a second layer of silicon nitride 320 is placed over the layer of silicon oxide 310 (step 835). Then an etch procedure is performed to etch the second layer of silicon nitride 320 to form first silicon nitride spacers 320a and 320b (step 840).

Then a diluted hydrofluoric acid (HF) etch procedure is performed to etch away exposed portions of the silicon oxide 310 and expose the second layer 160 of silicon germanium (SiGe) of the NSEG base 140 (step 845). Then a selective epitaxial growth (SEG) procedure is performed to grow a layer of in-situ doped polysilicon 510 to form a raised external base on the exposed second layer 160 of silicon germanium (SiGe) of the NSEG base to form structure 500 (step 850).

Then a third layer of silicon nitride 610 is placed over the structure 500 and the third layer of silicon nitride 610 is etched (1) to form second silicon nitride spacers 610a and 610b, and (2) to remove remaining portions of the first layer of silicon nitride 190 over the NSEG emitter 180 (step 855). Then a contact structure 710 is formed to provide an electrical contact to the top surface of the NSEG monocrystalline silicon emitter 180 (step 860).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of manufacturing a self aligned silicon germanium heterojunction bipolar transistor, the method comprising the steps of:
    forming a non-selective epitaxial growth (NSEG) collector;
    forming an NSEG base over the NSEG collector;
    forming an NSEG monocrystalline silicon emitter over the NSEG base; and
    performing a first etch process to remove non-central portions of the NSEG monocrystalline silicon emitter and non-central portions of the NSEG base;
    wherein the step of forming the NSEG base comprises the steps of:
        forming a first layer of the NSEG base over the NSEG collector, wherein the first layer of the NSEG base comprises a first layer of silicon;
        forming a second layer of the NSEG base over the first layer of the NSEG base, wherein the second layer of the NSEG base comprises a layer of silicon germanium; and
        forming a third layer of the NSEG base over the second lager of the NSEG base, wherein the third layer of the NSEG base comprises a second layer of silicon; and
    wherein performing the first etch process comprises removing the non-central portions of the NSEG monocrystalline silicon emitter and non-central portions of the third layer of the NSEG base down to the second layer of the NSEG base.

2. The method as claimed in claim 1, wherein:
    the first layer of the NSEG base is approximately ten nanometers thick;
    the second layer of the NSEG base is approximately thirty five nanometers thick; and
    the third layer of the NSEG base is approximately fifteen nanometers thick.

3. The method as claimed in claim 1, wherein the NSEG base and the NSEG emitter are formed during a single NSEG run.

4. The method as claimed in claim 1, further comprising the step of:
    forming a first layer of silicon nitride over the NSEG monocrystalline silicon emitter.

5. The method as claimed in claim 4, wherein performing the first etch process further comprises:
    removing non-central portions of the first layer of silicon nitride.

6. The method as claimed in claim 5, further comprising the steps of:
    placing a layer of silicon oxide over the first layer of silicon nitride and over the second layer of the NSEG base;
    placing a second layer of silicon nitride over the layer of silicon oxide; and
    performing a second etch process to form first silicon nitride spacers adjacent to the NSEG monocrystalline silicon emitter.

7. The method as claimed in claim 6, further comprising the steps of:
    performing a third etch process to remove portions of the layer of silicon oxide and expose portions of the second layer of the NSEG base; and
    forming an in-situ doped polysilicon layer on the second layer of the NSEG base to form a raised external base.

8. The method as claimed in claim 7, further comprising the steps of:
    placing a third layer of silicon nitride over the NSEG monocrystalline silicon emitter and over the doped polysilicon layer; and
    performing a fourth etch process to form second silicon nitride spacers adjacent to the first silicon nitride spacers and to remove remaining portions of the first layer of silicon nitride from the NSEG monocrystalline silicon emitter.

9. The method as claimed in claim 8, further comprising the step of:
    forming a contact structure in contact with a top surface of the NSEG monocrystalline silicon emitter.

10. A self aligned silicon germanium heterojunction bipolar transistor comprising:
    a non-selective epitaxial growth (NSEG) collector;
    an NSEG base over the NSEG collector; and
    an NSEG monocrystalline silicon emitter over the NSEG base,
    wherein the NSEG emitter and a first portion of the NSEG base extend above a second portion of the NSEG base; and
    wherein the NSEG base comprises:
        a first layer of the NSEG base over the NSEG collector, wherein the first layer of the NSEG base comprises a first layer of silicon;
        a second layer of the NSEG base over the first layer of the NSEG base, wherein the second layer of the NSEG base comprises a layer of silicon germanium; and
        a third layer of the NSEG base over the second layer of the NSEG base, wherein the third layer of the NSEG base comprises a second layer of silicon; and
    wherein non-central portions of the NSEG monocrystalline emitter and non-central portions of the third layer of the NSEG base are etched down to the second layer of the NSEG base.

11. The self aligned silicon germanium heterojunction bipolar transistor as claimed in claim 10, wherein:
    the first layer of the NSEG base is approximately ten nanometers thick;
    the second layer of the NSEG base is approximately thirty five nanometers thick; and
    the third layer of the NSEG base is approximately fifteen nanometers thick.

12. The self aligned silicon germanium heterojunction bipolar transistor as claimed in claim 10, wherein the NSEG base and the NSEG emitter are formed during a single NSEG run.

13. The self aligned silicon germanium heterojunction bipolar transistor as claimed in claim 10, wherein the first portion of the NSEG base comprises the third layer of the NSEG base.

14. The self aligned silicon germanium heterojunction bipolar transistor as claimed in claim 13, further comprising:
    a layer of silicon oxide over a first portion of the second layer of the NSEG base and adjacent to sidewalls of the NSEG emitter and the first portion of the NSEG base; and
    first silicon nitride spacers that are adjacent to the layer of silicon oxide.

15. The self aligned silicon germanium heterojunction bipolar transistor as claimed in claim 14, further comprising:
   an in-situ doped polysilicon layer forming a raised external base on a second portion of the second layer of the NSEG base.

16. The self aligned silicon germanium heterojunction bipolar transistor as claimed in claim 15, further comprising:
   second silicon nitride spacers adjacent to the first silicon nitride.

17. The self aligned silicon germanium heterojunction bipolar transistor as claimed in claim 16, further comprising:
   a contact structure in contact with a top surface of the NSEG monocrystalline silicon emitter.

18. The self aligned silicon germanium heterojunction bipolar transistor as claimed in claim 10, wherein the NSEG collector comprises a selective implanted collector beneath the NSEG emitter and the first portion of the NSEG base.

19. The method as claimed in claim 6, wherein the layer of silicon oxide confines a junction between the NSEG base and the NSEG emitter.

20. The self aligned silicon germanium heterojunction bipolar transistor as claimed in claim 14, wherein the layer of silicon oxide confines a junction between the NSEG base and the NSEG emitter.

* * * * *